(12) United States Patent
Olivier et al.

(10) Patent No.: US 10,365,305 B2
(45) Date of Patent: Jul. 30, 2019

(54) ROGOWSKI COIL TYPE SENSOR FOR MEASURING CURRENT, MEASURING DEVICE AND ELECTRICAL CIRCUIT BREAKER INCLUDING SUCH A SENSOR, AND METHOD FOR WINDING SUCH A SENSOR

(71) Applicant: Schneider Electric Industries SAS, Rueil Malmaison (FR)

(72) Inventors: Audrey Olivier, Teche (FR); Philippe Brunel, Eybens (FR); Sebastien Buffat, Tullins (FR); David Granier, Apprieu (FR)

(73) Assignee: SCHNEIDER ELECTRIC INDUSTRIES SAS, Rueil Malmaison (FR)

( * ) Notice: Subject to any disclaimer, the term of this patent is extended or adjusted under 35 U.S.C. 154(b) by 70 days.

(21) Appl. No.: 15/679,212

(22) Filed: Aug. 17, 2017

(65) Prior Publication Data
US 2018/0059152 A1    Mar. 1, 2018

(30) Foreign Application Priority Data
Aug. 31, 2016   (FR) .................................... 16 58081

(51) Int. Cl.
*G01R 19/00*    (2006.01)
*G01R 15/18*    (2006.01)

(52) U.S. Cl.
CPC ....... *G01R 19/0092* (2013.01); *G01R 15/181* (2013.01)

(58) Field of Classification Search
CPC ... G01R 19/0092; G01R 15/18; G01R 15/181
See application file for complete search history.

(56) References Cited

U.S. PATENT DOCUMENTS

| 5,012,218 A | * | 4/1991 | Haug | ................... | G01R 15/181 |
| | | | | | 324/127 |
| 6,018,239 A | * | 1/2000 | Berkcan | ............... | G01R 15/181 |
| | | | | | 324/127 |

(Continued)

OTHER PUBLICATIONS

French Preliminary Search Report dated May 26, 2017 in French Application 16 58081 filed on Aug. 31, 2016 (with English Translation of Categories of Cited Documents).

*Primary Examiner* — Walter L Lindsay, Jr.
*Assistant Examiner* — Milton Gonzalez
(74) *Attorney, Agent, or Firm* — Oblon, McClelland, Maier & Neustadt, L.L.P.

(57) ABSTRACT

The Rogowski coil type sensor for measuring current includes a carrier and at least one secondary winding. The winding includes: at least one internal layer with a high turn density, which layer is wound in an "outward" first winding direction from the first end to a second opposite end of the winding, and at least one external layer with a low turn density, which layer is wound in a "return" second winding direction. The external layer with a low turn density includes: a first compensating portion with a high turn density, which portion is of small length and close to the first end, a central portion with a low turn density, which portion is of large length, and a second compensating portion with a high turn density, which portion is of small length and close to the second end.

11 Claims, 6 Drawing Sheets

(56) References Cited

U.S. PATENT DOCUMENTS

2008/0079418 A1    4/2008   Rea et al.
2011/0043190 A1    2/2011   Farr
2015/0028853 A1    1/2015   Pascal et al.

* cited by examiner

ROGOWSKI COIL TYPE SENSOR FOR MEASURING CURRENT, MEASURING DEVICE AND ELECTRICAL CIRCUIT BREAKER INCLUDING SUCH A SENSOR, AND METHOD FOR WINDING SUCH A SENSOR

TECHNICAL FIELD

The invention relates to a Rogowski coil type sensor for measuring current comprising a carrier made of non-magnetic material and at least one secondary winding wound on the said carrier in order to supply an electrical signal representative of a current flowing in a conductor passing through the inside of the coil, together with a method for winding such a sensor.

The invention also relates to a measurement device and an electrical circuit breaker comprising such a sensor.

PRIOR ART

Rogowski coils are generally known in the field of power circuit breakers equipped with electronic trigger systems. They are used for the quality of their linearity and wide measurement dynamic range since they do not comprise any magnetic circuit able to be saturated. Thus, the precision is directly linked to the regularity of the winding and to the cross-section of the sensor.

Examples of Rogowski coil sensors used in electrical circuit breakers are described in the Patent applications EP2667205A1 and US2014132249A1.

The output signal from a Rogowski coil is given by the formula:

$$V = \mu \, n \, S \, di/dt$$

V being the voltage of the output signal supplied by the Rogowski coil, S the cross-section of a turn, $\mu_0$ the permeability, n the number of turns, and di/dt the derivative of a primary current with respect to time.

Thus, the voltage delivered by the coil is a function of the number of turns. The precision of the voltage is directly linked to the quality of the winding.

In the high-current electrical devices, this type of sensor is also sensitive to magnetic fields external to the coils if the winding is not perfect. Generally speaking, Rogowski coil sensors are associated with current transformers using a magnetic circuit to provide the power supply for electronic circuits. These current transformers are connected to switch-mode regulation circuits which generate interference for the electromagnetic environment of the current measurement sensors.

Some sensors comprise shielding in order to render them insensitive to external variations and interference. However, these solutions are not very efficient when the sensors are associated with current transformers for the electrical power supply of electronic circuits.

PRESENTATION OF THE INVENTION

The aim of the invention is a very precise Rogowski coil sensor able to be manufactured in volume production and being relatively insensitive to the variations of external electromagnetic fields, together with a method for winding such a sensor, and a measurement device and an electrical circuit breaker comprising such a sensor.

According to the invention, in a Rogowski coil type sensor for measuring current comprising a carrier made of non-magnetic material and at least one secondary winding wound on the said carrier for supplying an electrical signal representative of a current flowing within a conductor passing through the inside of the coil, the said secondary winding comprises at least two layers the electrical terminations of the windings of which are situated on one and the same first end of the winding, the said winding comprising:
- at least one internal layer with a high turn density close to the carrier and wound in a first winding direction of the first end towards a second opposite end of the winding, and
- at least one external layer with a low turn density comprising at least three portions and wound in a second winding direction from the second opposite end of the winding towards the first end, the said external layer with low turn density comprising:
  - a first compensation portion with a high turn density and of small length close to the first end of the winding,
  - a central portion with a low turn density and of large length, and
  - a second compensation portion with a high turn density and of small length close to the second end of the winding.

Preferably, in the said external layer with low turn density, the length of the long central portion is greater than ten times the sum of the lengths of the high-density portions.

In one preferred embodiment, the said winding comprises an even number of layers,
- one half of the layers being wound in a first winding direction from the first end towards the second opposite end of the winding, and
- the other half of the layers being wound in a second winding direction from the second opposite end of the winding towards the first end,
- the last layer being an external layer with a low turn density wound in the said second winding direction from the second opposite end of the winding towards the first end.

Preferably, the said winding comprises an even number of layers:
- one half of the layers being internal layers with a high turn density close to the carrier, and
- the other half of the layers being external layers with a low turn density comprising three portions,
- the last layer being an external layer with a low turn density wound in a second winding direction from the second opposite end of the winding to the first end.

In one particular embodiment, the said winding comprises:
- a first internal layer with a high turn density close to the carrier wound in a first winding direction from the first end towards the second opposite end of the winding,
- a second internal layer with a high turn density close to the carrier wound in a second winding direction from the second end towards the first opposite end of the winding,
- a first external layer with a low turn density comprising three portions wound in the first winding direction from the first end towards the second opposite end of the winding, and
- a second external layer with a low turn density comprising three portions wound in a second winding direction from the second opposite end of the winding towards the first end.

A method for winding a current measurement sensor such as defined hereinabove comprises:

the winding of at least one internal layer with a high turn density close to the carrier in a first winding direction from a first end towards a second opposite end of the winding, and the winding of at least one external layer with a low turn density comprising three portions in a second winding direction from the second opposite end of the winding towards the first end, the said external layer comprising:

a first compensation portion with a high turn density and of small length close to the first end of the winding, a central portion with a low turn density and of large length, and a second compensation portion with a high turn density and of small length close to the second end of the winding.

Preferably, the winding method comprises windings with an even number of layers, one half of the layers being wound in a first winding direction from the first end towards the second opposite end of the winding, and the other half of the layers being wound in a second winding direction from the second opposite end of the winding towards the first end, the last layer being an external layer with a low turn density wound in the second winding direction from the second opposite end of the winding towards the first end.

Advantageously, the winding method comprises windings with an even number of layers, one half of the layers being internal layers with a high turn density close to the carrier, and the other half of the layers being external layers with a low turn density, the last layer being an external layer with a low turn density wound in the second winding direction of the second opposite end of the winding to the first end.

In one particular embodiment, the winding method comprises:

the winding of at least a first internal layer with a high turn density close to the carrier in the first winding direction from the first end towards the second opposite end of the winding, the winding of at least a second internal layer with a high turn density close to the carrier in the second winding direction from the second end towards the first opposite end of the winding, the winding of at least a first external layer with a low turn density in the first winding direction from the first end towards the second opposite end of the winding, and the winding of at least a second external layer with a low turn density in the second winding direction from the second opposite end of the winding towards the first end.

A current measurement device comprising a processing unit for receiving signals representative of electrical currents comprises a measurement sensor such as defined hereinabove connected to the processing unit for supplying a current signal representative of a current flowing in an electrical conductor.

An electrical circuit breaker comprising at least one main contact for interrupting a current in an electrical circuit, a mechanism for controlling the opening of the said electrical contact and a measurement and protection device supplying a control signal to the said control mechanism comprises a measurement sensor such as defined hereinabove connected to a processing unit of the said measurement and protection device.

BRIEF DESCRIPTION OF THE DRAWINGS

Other advantages and features will become more clearly apparent from the description that follows, of particular embodiments of the invention, given by way of non-limiting examples, and represented in the appended drawings in which.

DETAILED DESCRIPTION OF EMBODIMENTS

Figure 1:
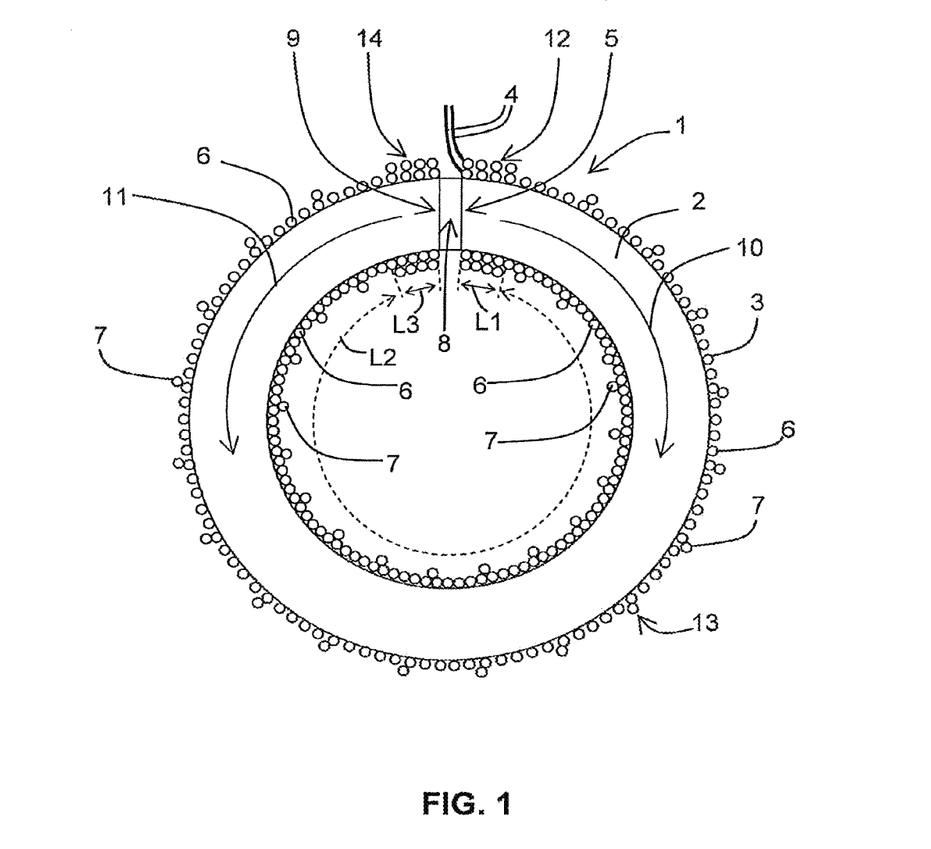
FIG. 1 shows a first schematic view of a sensor according to a first embodiment of the invention.

In the schematic view in FIG. 1 the current sensor 1 of the Rogowski coil type comprises a carrier 2 made of non-magnetic material and at least one secondary winding 3 wound on the carrier 2 for supplying an electrical signal representative of a current flowing in a conductor passing through the inside of the coil.

According to one embodiment of the invention, the secondary winding 3 comprises at least two layers the electrical terminations 4 of whose windings are situated at one and the same first end 5 of the winding 3. In order to reduce the sensitivity of the winding to the electromagnetic interference external to the coil, the winding comprises an even number of layers of winding in such a manner that the outputs 4 of the electrical conductor of the winding exit from the same side or of the same end 5 of the winding. Thus, the winding is wound in an "outward" first direction on a first layer 6, then in a "return" direction on a second layer 7. For practical reasons of fabrication of the coil, a portion 8 with no winding is provided between the first end 5 of the winding and a second opposite end 9 of the winding 3. The number of turns n of the winding being defined as a function of the desired signal and the number of layers being even in order to avoid interference, the turns are distributed over the layers of the winding with the windings in the "outward" direction and the "return" direction.

Thus, in order to guarantee a better immunity from electromagnetic interference external to the coil, the winding comprises at least one internal layer 6 with a high turn density close to the carrier 2 and wound in a first direction 10 of winding from the first end 5 towards the second opposite end 9 of the winding, and at least one external layer 7 with a low turn density comprising three portions and wound in a second winding direction 11 from the second opposite end 9 of the winding towards the first end 5.

The first internal layer 6 close to the carrier is preferably formed with adjoining turns on the interior side of the coil. In this document, the term 'internal layer' means the layer or layers closest to the carrier and 'external layer' means the layer or layers furthest from the carrier. High turn density means that the turns are joined or with a spacing lower than the diameter of the wire on the interior side of the coil. Low turn density means a spacing higher than the diameter of the wire on the interior side of the coil.

Low density layers means layers that have a low overall density, in other words they have portions with a low density over the major part of the length of the winding, but they may have small high-density portions. Notably, these high density portions may be situated close to the ends for turns compensating for the portions with no winding.

In this case, the second external layer 7 with a low density comprises:
- a first compensating portion 12 with a high turn density and of small length L1 close to the first end 5 of the winding,
- a central portion 13 with a low turn density and of large length L2, et
- a second compensating portion 14 with a high turn density and of small length L3 close to the second end 9 of the winding.

The compensating portions 12 and 14 allow the portion 8 with no winding between the ends 5 and 9 to be compensated.

Preferably, in a low-density layer, the small portions 12 and 14 with a high density have a winding length of less than $1/10$ of the length of the low-density winding. For example, (L1+L3)<(L2/10).

Figure 2:
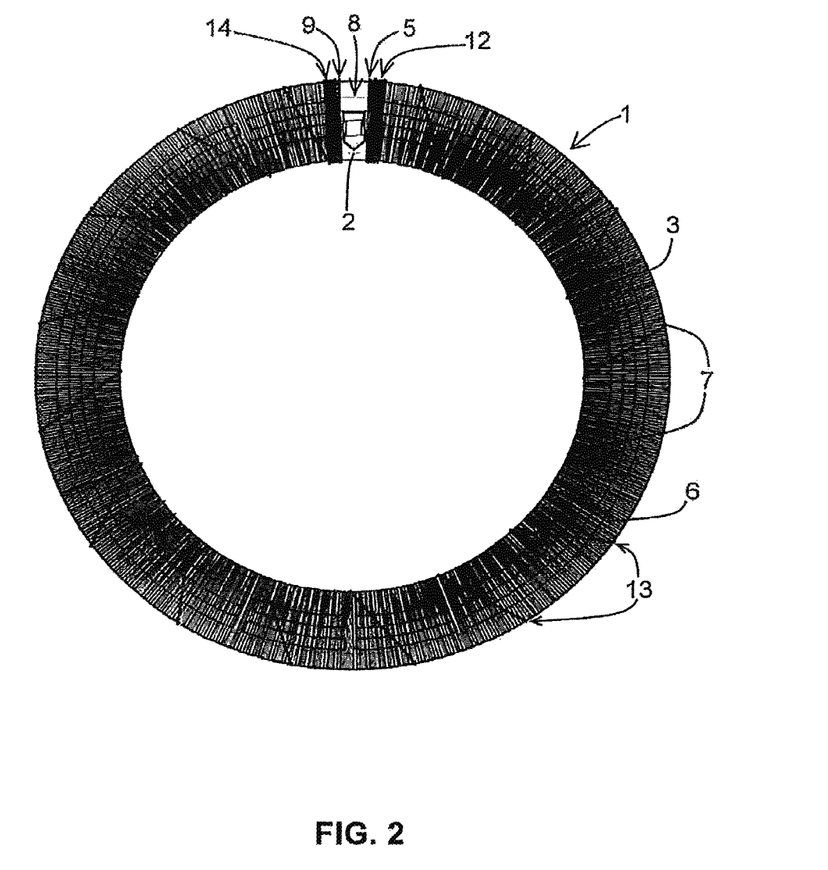
FIG. 2 shows a view of a sensor according to one embodiment of the invention.

FIG. 2 shows a view of a sensor according to the embodiment in FIG. 1. The first internal layer 6 is wound with adjoining turns on the carrier 2 of the coil. The second layer comprises a first compensating portion 12 with adjoining turns, a central low-density portion 13 whose turns are distributed over the body of the coil with a large interval between the turns, and a second compensating portion 14 with adjoining turns. The compensating portions compensate for the missing turns in the intermediate portion 8 with no winding. The length of the compensating portions 12 and 14 with a high density or with adjoining turns is preferably several millimeters. The central portion with a low density preferably has a length of several centimeters distributed over the circumference of the coil.

Figure 3:
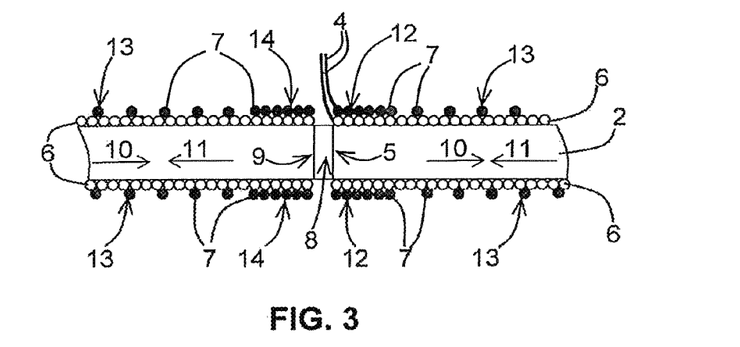
FIGS. 3 and 4 show partial schematic views of the winding ends according to two embodiments of the invention.

FIG. 3 shows a partial linear schematic view of the winding ends according to the first embodiment. The partial view shows the same configuration as that in FIG. 1 with an internal layer 6 with a high turn density close to the carrier wound in a first winding direction 10, and an external layer 7 with a low turn density comprising three portions and wound in the second winding direction 11 from the second opposite end 9 of the winding towards the first end 5.

In measurement sensors requiring a very high number of turns, the winding is distributed over several layers. Thus, according to embodiments of the invention with several layers, the winding comprises an even number of layers.

Advantageously, the layers are divided up in the following manner:
- one half of the layers are wound in a first winding direction 10 from the first end 5 towards the second opposite end 9 of the winding,
- the other half of the layers are wound in a second winding direction 11 from the second opposite end 9 of the winding towards the first end 5, and
- the last layer is an external layer 7, 107 with a low turn density comprising three portions and wound in a second winding direction 11 from the second opposite end 9 of the winding towards the first end 5.

The even number of layers will be also preferably be divided up in the following manner:
- one half of the layers are internal layers 6, 106 with a high turn density close to the carrier 2,
- the other half of the layers are external layers 7, 107 with a low turn density comprising three portions,
- the last layer is an external layer 7, 107 with a low turn density comprising three portions wound in a second winding direction 11 from the second opposite end 9 of the winding towards the first end 5.

Figure 4:
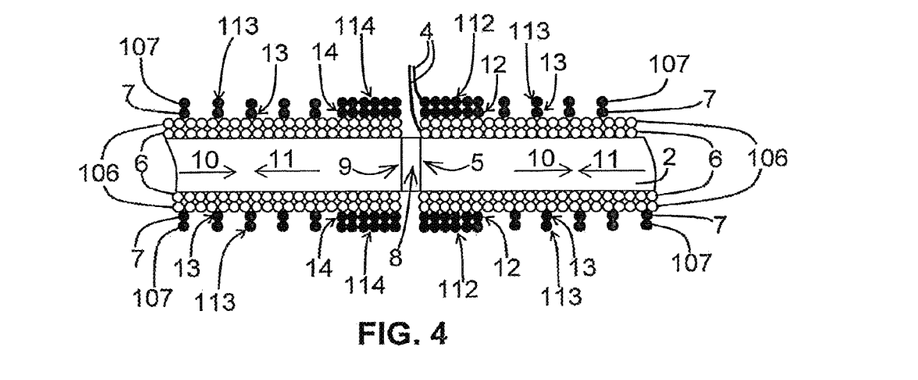

FIG. 4 shows a partial schematic view of the winding ends according to a second embodiment of the invention of a sensor with four layers. In this case, the winding with four layers is composed in the following manner:
- the first layer is a first internal layer 6 with a high turn density close to the carrier wound in the first winding direction 10 from the first end 5 towards the second opposite end 9 of the winding,
- the second layer is a second internal layer 106 with a high turn density close to the carrier wound in the second winding direction 11 from the second opposite end 9 towards the first end 5 of the winding,
- the third layer is a first external layer 7 with a low turn density comprising three portions wound in the first winding direction 10 of the first end 5 towards the second opposite end 9 of the winding, and
- the fourth is a second external layer 107 with a low turn density comprising three portions wound in the second winding direction 11 from the second opposite end 9 of the winding towards the first end 5.

In FIG. 4, the third and fourth layers are shown schematically in a perfectly superposed manner for the clarity of the description. However, since the turns are not very dense, in reality, the fourth layer may locally and partially drop to the level of the third while still being classed as the fourth layer.

Figure 5:
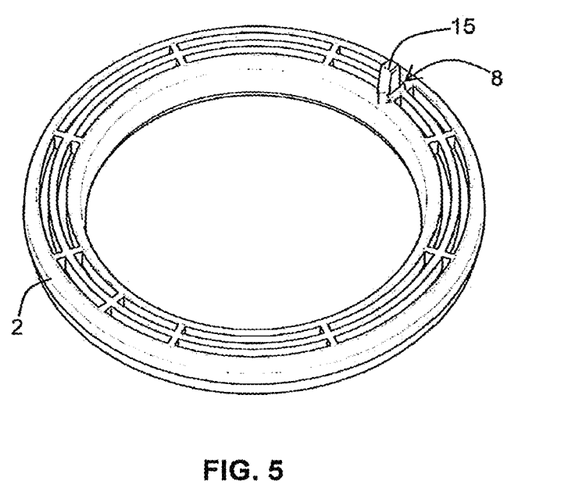
FIG. 5 shows a view of a carrier for a winding of a sensor according to one embodiment of the invention.

FIG. 5 shows a view of a carrier made of non-magnetic material of a winding for a sensor according to one embodiment of the invention. The intermediate portion with no winding will be located at the level of a spigot 15 for fixing or blocking the output wires 4 of the winding.

Figure 6:
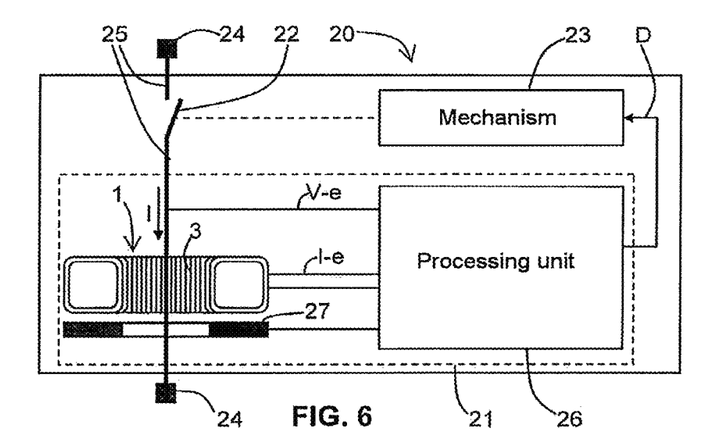
FIG. 6 shows a circuit diagram of an electrical circuit breaker comprising a sensor according to one embodiment of the invention.

FIG. 6 shows a circuit diagram of an electrical circuit breaker 20 comprising a sensor 1 according to one embodiment of the invention associated with a measurement and protection device 21. The electrical circuit breaker 20 comprises at least one main contact 22 for interrupting a current I in an electrical circuit, a mechanism 23 for controlling the opening of the said electrical contact 22 and the measurement and protection device 21 for supplying a control signal D to the said control mechanism 23. The circuit breaker also comprises power electrical terminals 24 for connecting external electrical conductors and internal link conductors 25 between the main contact 22 and the terminals 24. At least one current sensor 1 such as described hereinabove is disposed around a primary conductor 25 of the circuit breaker such as a link conductor 25 between a terminal 24 and a main contact 22. The current sensor 1 is connected to a processing unit 26 of the measurement and protection device 21 for supplying signals I-e representative of an electrical current flowing in the conductor primary I. Thus, the processing unit receives signals I-e representative of an electrical current of the sensor 1, carries out the processing of the current signals, carries out the protection and reporting functions and, if needed, supplies a signal or a triggering command D to the mechanism 23 for opening the contacts 22 of the circuit breaker. A current transformer 27 with a magnetic circuit is connected to the processing unit in order to supply electrical energy intended for the operation of the electronic circuits.

The secondary winding 3 is connected to an input of the processing unit 26 for supplying the current measurement signal I-e. The processing unit may also receive a voltage measurement signal V-e from the primary conductor 25. In this case, the processing unit may also carry out the processing and the calculation of the electrical energy and/or power with a very high precision.

In FIG. 6, only one circuit breaker with one phase or pole is shown. However, the invention is also applicable to multipolar circuit breakers notably to three-phase circuit breakers. In this case, each protected pole comprises a current sensor such as defined hereinabove.

The measurement and protection device 21, comprising the sensor 1 and the processing unit 26, may be an electronic trigger for a circuit breaker but also a relay or a module for protection and/or for power measurement and/or of electrical energy.

Figure 7:
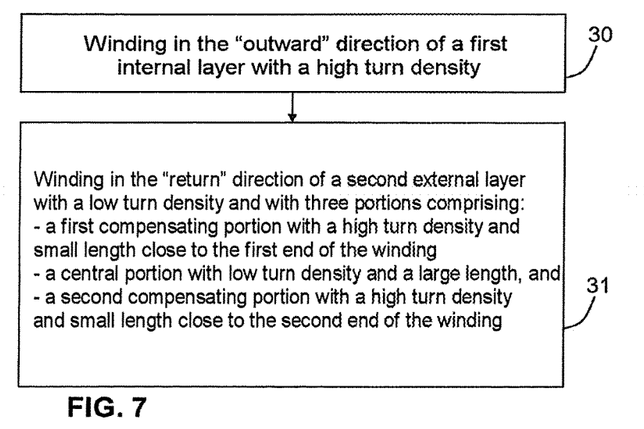
FIG. 7 shows the steps of a winding method for a sensor according to a first embodiment of the invention.

FIG. 7 shows the steps of a winding method for a current measurement sensor according to a first embodiment of the invention. The winding method comprises a first step 30 for winding at least one internal layer with a high turn density close to the carrier in a first winding direction 10 from the first end 5 towards a second opposite end 9 of the winding. The first winding direction 10 will be called "outward" direction. The high turn density preferably has adjoining turns. In a second winding step 31, at least one external layer with a low turn density comprising three portions is wound in a second winding direction 11 from the second opposite end 9 of the winding towards the first end 5. The second winding direction will be called "return" direction. The external low-density layer comprises:
  a first compensating portion 12, 112 with a high turn density and of small length L1 close to the first end 5 of the winding,
  a central portion 13, 113 with a low turn density and of large length, and
  a second compensating portion 14, 114 with a high turn density and of small length L2 close to the second opposite end 9 of the winding.

For the winding methods, according to the invention, with several layers, the winding comprises an even number of layers divided up in the following manner:
  one half of the layers are wound in a "outward" first direction of winding 10 from the first end 5 towards the second opposite end 9 of the winding,
  the other half of the layers are wound in a second "return" direction of winding 11 from the second opposite end 9 of the winding towards the first end 5, and
  the last layer is an external layer 7, 107 with a low turn density comprising three portions and wound in a second winding direction 11 from the second opposite end 11 of the winding towards the first end 5.

For example, with this method it is possible to have more high-density layers and fewer low-density layers as long as the last layer is a low-density layer.

In the methods, the even number of layers will also preferably be divided up in the following manner:
  one half of the layers are internal layers 6, 106 with a high turn density close to the carrier 2,
  the other half of the layers are external layers 7, 107 with a low turn density comprising three portions,
  the last layer is an external layer 7, 107 with a low turn density comprising three portions wound in the "return" direction.

Figure 8:
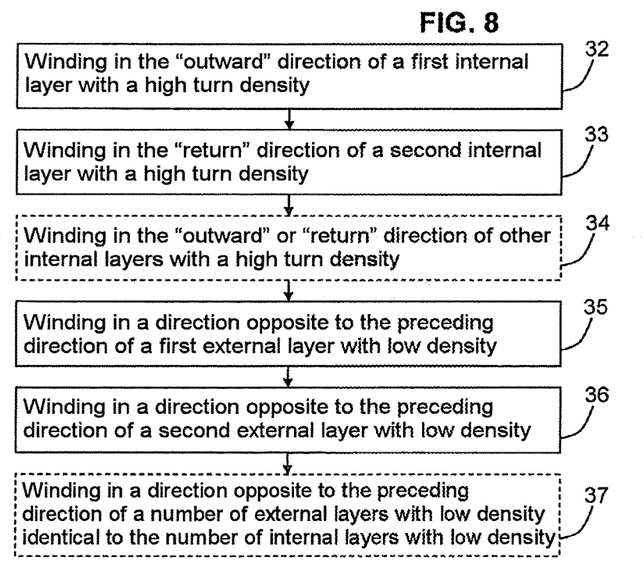
FIGS. 8 and 9 show the steps of a winding method for a sensor according to one of the other embodiments of the invention.

FIG. 8 shows the steps of a winding method for a sensor according to a multilayer embodiment. The method comprises a first step 32 for winding a first internal layer with a high turn density close to the carrier wound in the "outward" direction, then a second step 33 for winding a first internal layer with a high turn density close to the carrier wound in the "return" direction. A step 34 shows other possible steps for internal layers with a high turn density. The method also comprises a step 35 for winding a first external layer with a low turn density wound in the direction opposite to the direction of its preceding layer. Other external layers with a low turn density wound in the direction opposite to the direction of their preceding layer may be wound at a step or at steps 36. The last step 35 or 36 will, in any case, wind an external layer with a low turn density in the "return" direction.

The step 37 shows a case where the number of external layers with a low density is equal to the number of internal layers with a high density. The direction of the windings is alternated "outward" and "return".

Figure 9:
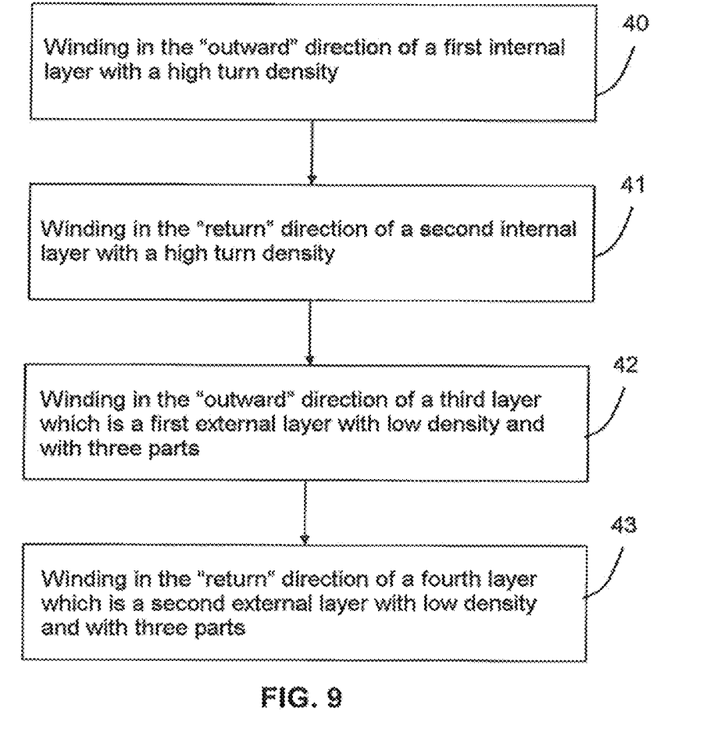

FIG. 9 shows the steps of a winding method of a sensor according to one preferred embodiment with four layers. In this method, there is first of all a first step 40 for winding a first internal layer 6 with a high turn density close to the carrier in a first "outward" winding direction 10, and a second step 41 for winding a second internal layer 106 with a high turn density close to the carrier in a second "return" direction 11. Subsequently, there is a third step 42 for winding a first external layer 7 with a low turn density in the first "outward" winding direction 10, and a fourth step 43 for winding a second external layer 107 with a low turn density in the second "return" winding direction 11.

Figure 10:
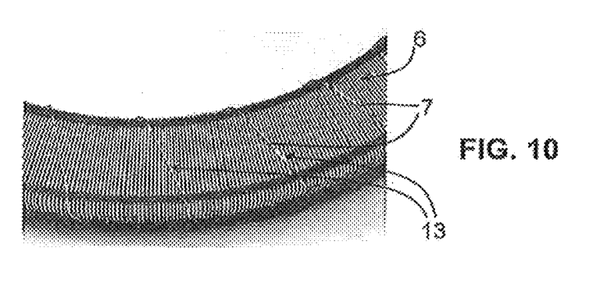
FIG. 10 shows a photo of a partial view of a coil according to one embodiment.

A photograph of a portion of a sensor according to one embodiment is shown in FIG. 10. The winding 3 is wound with a high turn density on the first layer 6 and with a low turn density on the second layer 7. Turns of the central portion 13 are very spaced out in order to guarantee an exact number of turns for the measurement sensor.

The invention claimed is:
1. A current measurement sensor, comprising:
  a carrier made of non-magnetic material; and
  at least one secondary winding wound on said carrier and being configured to supply an electrical signal representative of a current flowing in a conductor passing through an inside of a coil, the at least one secondary winding comprising:
    at least two layers,
    electrical terminations being situated on a same first end of the at least one secondary winding,
    at least one internal layer of the at least two layers having a high turn density close to the carrier and being wound in a first winding direction from the same first end toward a second opposite end of the at least one secondary winding, and
    at least one external layer of the at least two layers having a low turn density comprising at least three portions and being wound in a second winding direction from the second opposite end of the at least one secondary winding toward the same first end, the at least one external layer comprising:
      a first compensation portion having a high turn density and having a small length, being disposed close to the same first end, a central portion having a low turn density and having a large length, and a second compensation portion having a high turn density and having a small length, being disposed close to the second opposite end.

2. The current measurement sensor according to claim 1, wherein a length of the central portion is greater than ten times a sum of lengths of the first compensation portion and the second compensation portion.

3. The current measurement sensor according to claim 1, wherein the at least one secondary winding comprises an even number of layers, one half of the even number of layers being wound in the first winding direction from the same first end toward the second opposite end of the at least one secondary winding, the other half of the even number of layers being wound in the second winding direction from the second opposite end of the at least one secondary winding toward the same first end, and a last layer of the other half of the even number of layers being an external layer having a low turn density and being wound in the second winding direction from the second opposite end of the at least one secondary winding toward the same first end.

4. The current measurement sensor according to claim 1, wherein the at least one secondary winding comprises an even number of layers, one half of the even number of layers being internal layers having a high turn density close to the carrier, the other half of the even number of layers being external layers having a low turn density comprising three portions, and a last layer of the other half of the even number of layers being an external layer having a low turn density and being wound in the second winding direction from the second opposite end of the at least one secondary winding toward the same first end.

5. The current measurement sensor according to claim 1, wherein the at least one secondary winding comprises:

a first internal layer having a high turn density close to the carrier and being wound in the first winding direction from the same first end toward the second end of the at least one secondary winding, a second internal layer having a high turn density close to the carrier and being wound in the second winding direction from the second opposite end toward the same first end of the at least one secondary winding, a first external layer having a low turn density comprising three portions wound in the first winding direction of the same first end toward the second opposite end of the at least one secondary winding, and a second external layer having a low turn density comprising three portions wound in the second winding direction from the second opposite end toward the same first end of the at least one secondary winding.

6. A winding method for a current measurement sensor according to claim 1, comprising:

winding at least one internal layer having a high turn density close to the carrier in a first winding direction from a first end toward a second opposite end of the winding; and winding at least one external layer having a low turn density comprising three portions in a second winding direction from the second opposite end toward the first end, the at least one external layer comprising:

a first compensation portion having a high turn density and having a small length, being disposed close to the first end, a central portion having a low turn density and having a large length, and a second compensation portion having a high turn density and having a small length, being disposed close to the second opposite end.

7. The winding method according to claim 6, further comprising forming windings with an even number of layers, one half of the even number of layers being wound in the first winding direction from the same first end toward the second opposite end, the other half of the even number of layers being wound in the second winding direction from the second opposite end toward the first end, and a last layer of the other half of the even number of layers being an external layer having a low turn density and being wound in the second winding direction from the second opposite end toward the first end.

8. The winding method according to claim 6, further comprising forming windings with an even number of layers, one half of the even number of layers being internal layers having a high turn density close to the carrier, the other half of the even number of layers being external layers having a low turn density. and a last layer of the other half of the even number of layers being an external layer having a low turn density and being wound in the second winding direction from the second opposite end to the first end.

9. The winding method according to claim 6, further comprising:

winding at least a first internal layer having a high turn density close to the carrier in the first winding direction from the first end toward the second opposite end, winding at least a second internal layer having a high turn density close to the carrier in the second winding direction from the second opposite end toward the first end, winding at least a first external layer having a low turn density in the first winding direction from the first end toward the second opposite end, and winding at least a second external layer having a low turn density in the second winding direction from the second opposite end toward the first end.

10. A current measurement device comprising a processing unit configured to receive signals representative of electrical currents, comprises a measurement sensor according to claim 1 connected to the processing unit and being configured to supply a current signal representative of a current flowing in an electrical conductor.

11. An electrical circuit breaker, comprising:

at least one main contact configured to interrupt a current in an electrical circuit;

a control mechanism configured to control an opening of said electrical contact; and a measurement and protection device configured to supply a control signal to said control mechanism, comprising a measurement sensor according to claim 1 connected to a processing unit of said measurement and protection device.

* * * * *

UNITED STATES PATENT AND TRADEMARK OFFICE
CERTIFICATE OF CORRECTION

PATENT NO. : 10,365,305 B2
APPLICATION NO. : 15/679212
DATED : July 30, 2019
INVENTOR(S) : Audrey Olivier et al.

It is certified that error appears in the above-identified patent and that said Letters Patent is hereby corrected as shown below:

In the Specification

In Column 4, Line 34, delete "FIG. 1" and insert -- FIG. 1, --, therefor.

In the Claims

In Column 8, Line 54, Claim 1, delete "lavers" and insert -- layers --, therefor.

In Column 9, Line 29, Claim 4, delete "lavers" and insert -- layers --, therefor.

In Column 9, Line 43, Claim 5, delete "second end" and insert -- second opposite end --, therefor.

In Column 10, Line 29 approx., Claim 8, delete "density." and insert -- density, --, therefor.

Signed and Sealed this
Seventeenth Day of November, 2020

Andrei Iancu
*Director of the United States Patent and Trademark Office*